United States Patent [19]
Gossner et al.

[11] Patent Number: 5,828,076
[45] Date of Patent: Oct. 27, 1998

[54] MICROELECTRONIC COMPONENT AND PROCESS FOR ITS PRODUCTION

[75] Inventors: Harald Gossner, München; Ignaz Eisele, Icking; Lothar Risch, Neubiberg, all of Germany; Erwin Hammerl, Stormville, N.Y.

[73] Assignee: Siemens Aktiengesellschaft, Munich, Germany

[21] Appl. No.: 727,440

[22] PCT Filed: Apr. 4, 1995

[86] PCT No.: PCT/DE95/00448

§ 371 Date: Oct. 17, 1996

§ 102(e) Date: Oct. 17, 1996

[87] PCT Pub. No.: WO95/28741

PCT Pub. Date: Oct. 26, 1995

[30] Foreign Application Priority Data

Apr. 19, 1994 [DE] Germany .......................... 44 13 470.3

[51] Int. Cl.⁶ ...................................................... H01L 29/06
[52] U.S. Cl. .............................. 257/24; 257/14; 257/327; 257/329; 438/197; 438/212
[58] Field of Search ................. 257/24, 14, 288, 257/327, 329; 438/197, 212

[56] References Cited

U.S. PATENT DOCUMENTS 5,313,484   5/1994   Arimoto .................................... 372/46

FOREIGN PATENT DOCUMENTS

| 35 45 243 | 6/1987 | Germany . |
|---|---|---|
| 55-61070 | 5/1980 | Japan . |
| 56-71974 | 6/1981 | Japan . |
| 61-170070 | 7/1986 | Japan . |
| 2-174268 | 7/1990 | Japan . |
| 5-29613 | 2/1993 | Japan . |
| 5-121320 | 5/1993 | Japan . |
| 6-21052 | 1/1994 | Japan . |
| 6-53488 | 2/1994 | Japan . |

OTHER PUBLICATIONS

Fukui et al, "MOCVD methods for fabricating GaAs quantum wires and quantum dots", Journal of Crystal Growth 124 (1992), pp. 493–496.

Brunner et al, "Excitonic luminescence from locally grown SiGe wires and dots", Appl. Phys. Lett. 64(8), Feb. 21, 1994, pp. 994–996.

Reed, "Quantenpunkte", Spektrum der Wissenschaft, Mar. 1993, pp. 52–57.

Licharew et al, "Elektronik mit einzelnen Elektronen", Spektrum der Wissenschaft, Aug. 1992, pp.62–67.

Caro, "Quantum transport in nanostructured silicon MOSFETs", Microelectronic Engineering 22, 1993, pp.153–162, no month.

Eberl et al, "Quantum wires prepared by molecular beam epitaxy regrowth on patterned AIGaAs buffer layers", Appl. Phys. Lett. 63(8), Aug. 23, 1993, pp. 1059–1061.

Nötzel et al, "Direct Synthesis of Semiconductor Quantum–Wire and Quantum–Dot Structures", Advanced Materials, 193, pp. 22–29, no month.

*Primary Examiner*—Sara W. Crane
*Attorney, Agent, or Firm*—Hill, Steadman, & Simpson

[57] ABSTRACT

In its gate region (10), a silicon MOS technology component has a surface structure (6) having edges and/or vertices at which inversion regions, suitable as quantum wires or quantum dots, are preferentially formed when a gate voltage is applied. The surface structure is preferably formed as a silicon pyramid (6) by local molecular beam epitaxy.

5 Claims, 4 Drawing Sheets

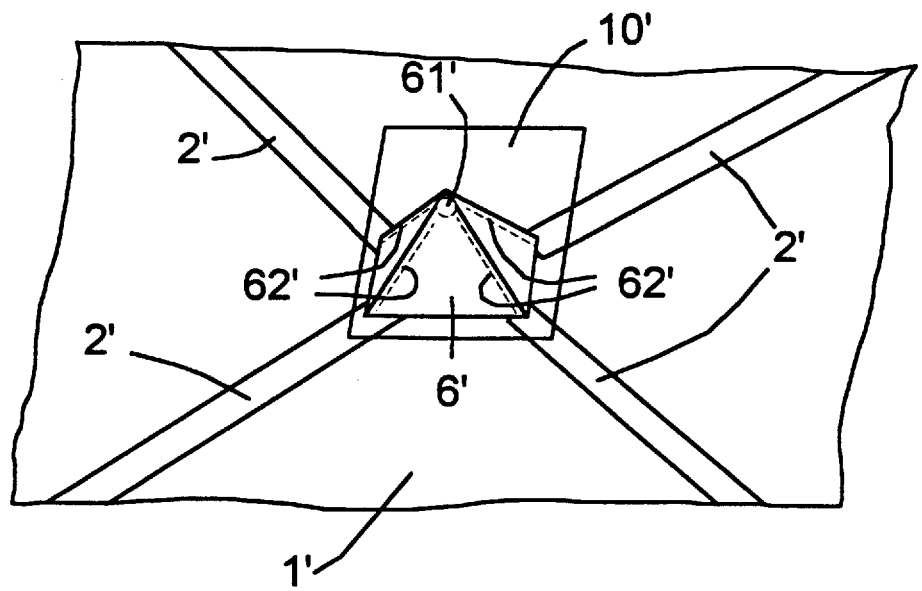
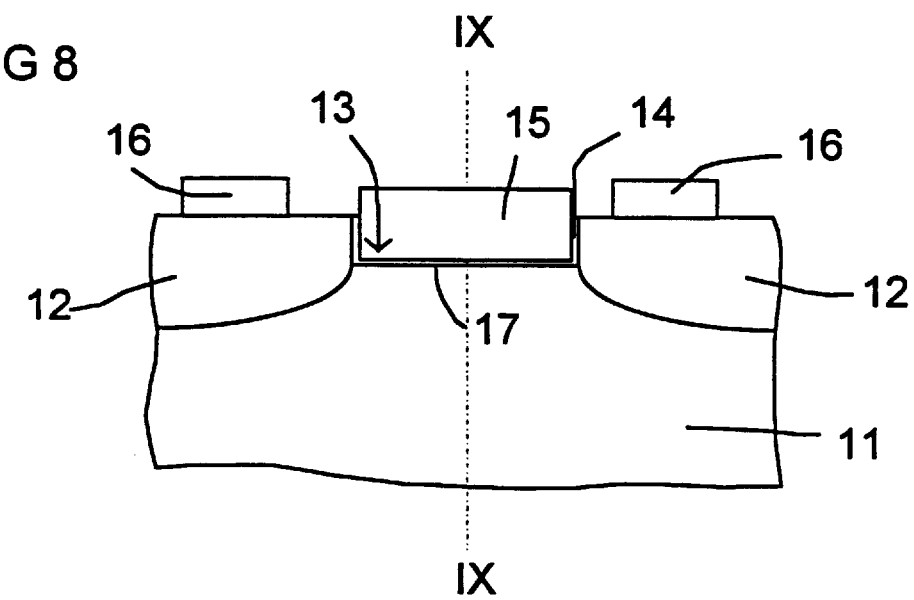

MICROELECTRONIC COMPONENT AND PROCESS FOR ITS PRODUCTION

BACKGROUND OF THE INVENTION

1. Field of the Invention

The present invention relates to a silicon MOS technology component wherein a gate region has a surface structure having edges and/or vertices at which inversion regions, suitable as quantum wires or quantum dots, are preferentially formed when a gate voltage is applied. The surface structure is preferably formed as a silicon pyramid.

2. Description of the Related Art

Single-electron components, which are regarded as promising alternatives for conventional CMOS technology with a view to higher integration density and/or higher operation speeds, have one or more nodes which can only be charging or discharging through high-impedance potential barriers. This charging/discharging is explained by a quantum-mechanical tunneling effect. The charging and discharging of a node by one elementary charge corresponds to a charge transfer of one electron across the potential barrier. This requires an activation energy which depends on the capacitance of the node. So long as the thermal energy of the system is very much less than this activation energy, this charge transfer is prohibited. A charge transit is then possible only through application of an external voltage.

The potential barrier is effective only so long as the operating temperature of the single-electron component is small enough for the thermal energy of the system to be very much less than the activation energy required for a charge transfer.

In order to make it possible for the single-electron component to be operated at technically employable temperatures, most preferably at room temperature, the energy balance dictates that the capacitance and therefore the size of the nodes must be kept as small as possible.

Conductive regions with very small dimensions, which are referred to as quantum dots, are used as nodes for producing a single-electron component in the semiconductor material. In view of the operating temperature of the single-electron component, quantum dots with dimensions of less than 10 nm are required. Conductive regions which are of a small extent in only two dimensions are referred to as quantum wires.

It has been proposed (see, for example, the publication by M. A. Reed, Spektrum der Wissenschaft 3 (1993) page 52 and J. Caro, Mictroelectronic Engineering 22 (1993) page 153) to produce small conductive regions in the semiconductor material while using gates as inversion layers. The achievable dimensions of such conductive regions depend on the form of the gates employed. It is also then possible to produce locally restricted inversion layers by using structured gates. In this case, inversion layers with dimensions in the nanometer range require gate structures in the nanometer range, which can only be produced with corresponding resolution by expensive lithography processes.

In the publication by R. Nötzel et al. Adv. Mater. 5 (1993) page 22, and K. Eberl et al., Appl. Phys. Lett. 63 (1993) page 1059, it has been proposed to use GaAs/AlGaAs layers which are not grown in planar fashion. This produces lateral structuring of the conducting heterolayer during the epitaxial growth.

SUMMARY OF THE INVENTION

An object of the invention is to provide a component which is suitable as a single-electron component and comprises conductive regions whose size is not limited by the resolution of the lithography employed. A further object of the invention is to provide a production process for such a component. These and other objects of the invention are achieved by a microelectronic component, having a substrate which comprises monocrystalline silicon at least at a main face, and which comprises, at the main face, at least one surface structure having at least three faces intersecting at an intersection point which intersect in pairs on a straight intersection line, a gate dielectric which covers the surface structure at least at the intersecting faces, a gate electrode which is arranged on the surface of the gate dielectric, having at least two conductive regions, which are arranged at the main face, in each case on at least one of the straight intersection lines and are insulated from the substrate, and between which, by applying a control voltage to the gate electrode, it is possible to control a current flow across an inversion layer which is formed along the intersection zone of the intersecting faces and at the intersection point when the control voltage is applied to the gate electrode.

The component preferably has a monocrystalline silicon pyramid which projects above the main face, and the conductive regions are produced as diffusion regions in the substrate, the surface structure and the substrate being doped with a first conductivity type, and the conductive regions being doped with a second conductivity type, opposite to the first.

A process for producing a microelectronic component is also provided wherein a substrate comprising monocrystalline silicon at least at a main face is provided at the main face with a surface structure having at least two faces intersecting at an intersection zone, a mask which covers the main face outside the surface structure is produced in order to produce the surface structure, a monocrystalline silicon pyramid is formed by epitaxial growth of silicon on the exposed main face of the substrate, a gate dielectric which covers at least the intersecting faces of the surface structure is produced, a gate electrode is produced on the surface of the gate dielectric, two conductive regions are produced at the main face of the substrate, the two conductive regions being insulated from the substrate and between which, by applying a control voltage to the gate electrode, it is possible to control a current flow across an inversion layer which is formed along the intersection zone of the intersecting faces when the control voltage is applied to the gate electrode.

Preferably, the mask is formed, from a double layer comprising a silicon oxide layer and a silicon nitride layer, in such a way that the silicon oxide layer has undercut etches under the silicon nitride layer, and the pyramid is produced by local molecular beam epitaxy.

In the process as described above, the substrate comprises silicon doped with a first conductivity type, the conductive regions are produced in the substrate as diffusion regions which are doped with a second conductivity type, opposite to the first, before the pyramid is formed, the pyramid is doped in situ with the first conductivity type, and the mask is removed after the pyramid is formed.

The component according to the invention comprises a substrate having monocrystalline silicon at least at a main face. The substrate may be a silicon wafer or an SOI substrate.

At the main face, the substrate has a surface structure having at least two faces intersecting at an intersection zone. The intersecting faces form an edge or, in the case of more than two faces, form a vertex from which edges diverge. The surface structure is covered, at least at the intersecting faces, with a gate dielectric on which a gate electrode is arranged.

At least two conductive regions, which are insulated from the substrate, are arranged at the main face. The conductive regions are arranged on different sides of the surface structure and are adjacent to the edges or one of the edges.

When a control voltage is applied to the gate electrode, an inversion layer is formed along the intersection zone of intersecting faces. A current flow between the two conductive regions across this inversion layer can be controlled by applying the control voltage.

The invention makes use of the discovery that, in silicon MOS components, an enhanced electric field occurs at vertices or edges of the silicon/dielectric interface, and the conditions for an inversion layer are fulfilled in this zone even when a small control voltage is applied. This means that an inversion layer is formed at vertices or edges even when on application of a control voltage which is insufficient to form an inversion layer at a planar interface. Here again a smaller control voltage is required for an inversion layer at a vertex than for an inversion layer at an edge.

The surface structure in the component according to the invention may project from the main face, for example in the form of a silicon pyramid, or alternatively be an indentation in the main face.

In the case of an indentation, the surface structure is preferably produced by crystal orientation-dependent etching, for example with KOH or ethylene-diamine. A trench with V-shaped cross section is then formed in the main face.

For production on the main face, in the case of a raised surface structure, it is within the scope of the invention to first produce an auxiliary structure which covers the zone for the surface structure. The main face of the substrate is then isotropically etched selectively with respect to the auxiliary structure, until the auxiliary structure is lifted off by coalescence of lateral undercut etches. The auxiliary structure may, for example, be produced from $SiO_2$, $Si_3N_4$ or a metal. The isotropic etching is then carried out with hydrofluoric acid or phosphoric acid. To make the surface structure more pointed, it is within the scope of the invention to follow this with thermal oxidation and subsequently to etch back the $SiO_2$ then formed.

Preferably, a raised surface structure in the component according to the invention is produced by epitaxial growth of silicon while using a mask. To this end, the main face is covered with the mask outside the surface structure. During the epitaxial growth of silicon, {111} faces grow preferentially, so that a pyramid is formed. It is particularly advantageous to form the pyramid by local molecular beam epitaxy, since it is then possible to achieve a radius of curvature at the vertex of less than 10 nm.

The size of the inversion layers in the component according to the invention is dependent on the radius of curvature of the edges or vertices, which is independent of the lithographic steps. In the case of an epitaxially grown surface structure, the radius of curvature depends only on the orientation of the crystal faces grown, and not on the lithographic steps.

It is further within the scope of the invention to produce the surface structure by naturally grown crystalline steps at the main face, or by using a silicon substrate whose main face is tilted with respect to a crystal orientation. Such a silicon substrate with a tilted main face has crystalline steps at the main face. It is, for example, produced by grinding.

BRIEF DESCRIPTION OF THE DRAWINGS

The invention will be explained in more detail below with the aid of illustrative embodiments and figures, in which:

FIG. 7 is a top perspective view which shows a component according to the invention having four conductive regions and a pyramidal surface structure.

FIG. 8 is a side cross section along line VIII—VIII of FIG. 9 and showing a component according to the invention, having a surface structure which is produced as an indentation in a main face of a substrate.

DETAILED DESCRIPTION OF THE PREFERRED EMBODIMENTS

Figure 1:
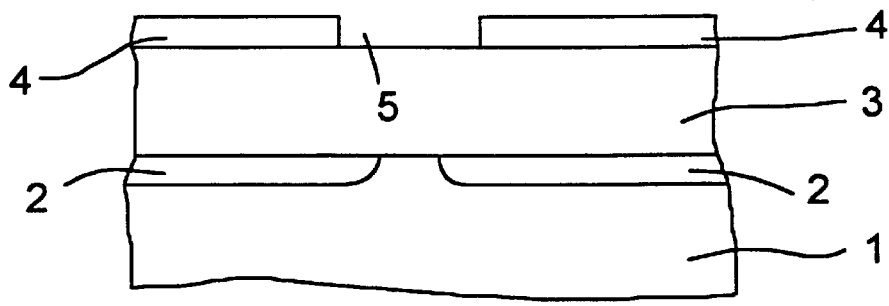
FIG. 1 is a side view which shows a section through a silicon substrate having conductive regions, a silicon oxide layer and a structured silicon nitride layer.

Two doped regions 2 are produced, for example by masked ion implantation, in a main face of a substrate 1 of, for example, monocrystalline silicon with a [100] surface (see FIG. 1). The substrate 1 is, for example, $p^-$-doped with a dopant concentration of $10^{16}$ to $10^{18}$ $cm^{-3}$. The doped regions 2 are, for example, $n^+$-doped with a dopant concentration of $10^{19}$ to $10^{20}$ $cm^{-3}$.

A 1 $\mu$m thick silicon oxide layer 3 is applied over the entire area of the main face of the substrate 1 by thermal oxidation at, for example, 1050° C. A 50 to 100 nm thick silicon nitride layer 4 is applied onto the silicon oxide layer 3 in an LPCVD (low pressure chemical vapor deposition) process at 700° C. Using a mask (not shown), which is produced by means of conventional photolithography or with a different lithography process, the silicon nitride layer 4 is structured by anisotropic etching in a $CF_4$ plasma, so as to create an opening 5 in which the surface of the silicon oxide layer 3 is exposed.

Figure 2:
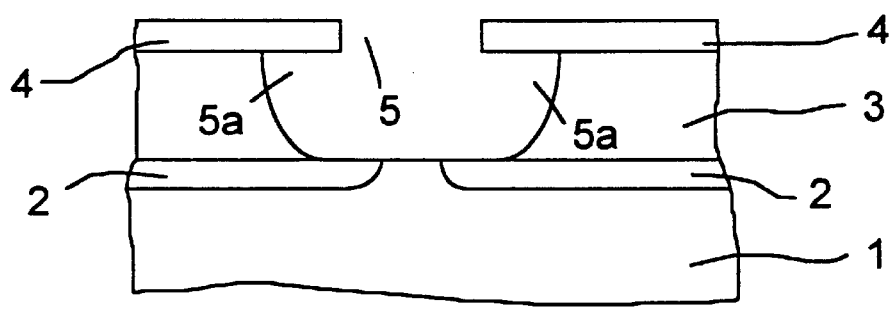
FIG. 2 is a side cross section which shows the silicon substrate after structuring of the silicon oxide layer to form a mask.

Using the structured silicon nitride layer 4 as a mask, the silicon oxide layer 3 is etched selectively with respect to the silicon nitride layer 4, for example with buffered hydrofluoric acid. The main face of the substrate 1 is then exposed. At the same time, undercut etches 5a of the silicon oxide layer 3 under the silicon nitride layer 4 are created (see FIG. 2). The silicon oxide layer 3 and the silicon nitride layer 4 are structured in such a way that, at the opening 5, the surface of the doped regions 2 is also partly exposed.

Parallel to the main face of the substrate 1, the opening 5 has a square cross section. The square cross section is oriented in the [110] direction of the (100) silicon substrate 1. On the surface of the silicon nitride layer 4, the opening 5 has a side length of approximately 350 nm.

Figure 3:
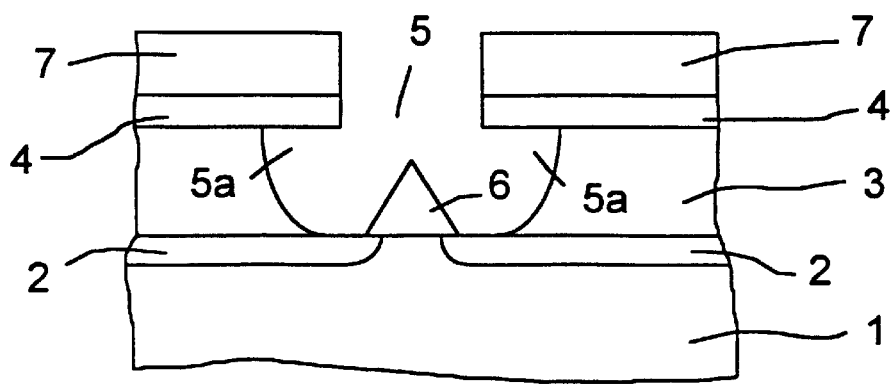
FIG. 3 is a side cross section which shows the silicon substrate after epitaxial growth of a pyramid.

Using the structured silicon oxide layer 3 and silicon nitride layer 4 as a mask, a pyramid 6 is grown by molecular beam epitaxy of doped silicon on the exposed surface of the substrate 1 or of the doped regions 2. At the same time, a doped silicon layer 7 is deposited on the surface of the silicon nitride layer 4 (see FIG. 3). The molecular beam epitaxy is carried out with a substrate temperature, during the epitaxy process, of between 400° C. and 700° C., and with a deposition rate of between 0.01 nm/sec and 0.5 nm/sec. The pyramid 6 grows because of a physically induced self-organizing growth process, the side faces of the pyramid 6 being (111) faces. The pyramid 6 grows to a height of, for example, 250 nm. At the same time, amorphous or polycrystalline growth of the doped silicon layer 7 takes place to a thickness of, for example, 300 nm. The pyramid 6 is p-doped with a dopant concentration of, for example, $3 \times 10^{17} cm^{-3}$.

In a lift-off process, in which the silicon oxide layer 3 is etched selectively, for example with hydrofluoric acid, the silicon oxide layer 3, the silicon nitride layer 4 and the doped silicon layer 7 deposited thereon are removed.

The pyramid 6 extends with two opposite side faces to the surface of each of the doped regions 2. Two edges of the pyramid 6 terminate on each of the doped regions 2.

Figure 4:
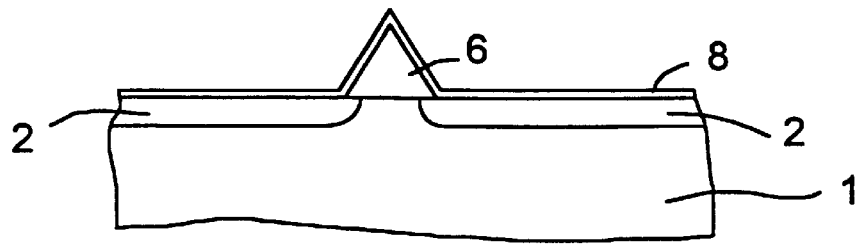
FIG. 4 is a side cross section which shows the silicon substrate after removal of the mask and growth of a gate dielectric.
Figure 5:
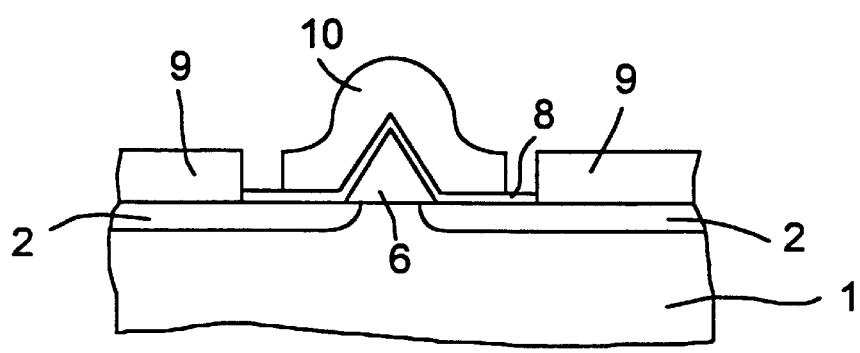
FIG. 5 is a side cross section which shows the silicon substrate after production of the gate electrode, source electrode and drain electrode.

A gate oxide 8 is applied to a thickness of, for example, 5 to 10 nm, for example by thermal oxidation or by CVD (see FIG. 4). The gate oxide 8 is at least partly removed on the surface of the doped regions 2 (see FIG. 5). Electrodes 9 accessing, or connected to, the doped regions 2 and a gate electrode 10, which covers the pyramid 6, are formed by depositing a conductive layer, for example of doped polysilicon, metal silicide or metal, and structuring.

Figure 6:
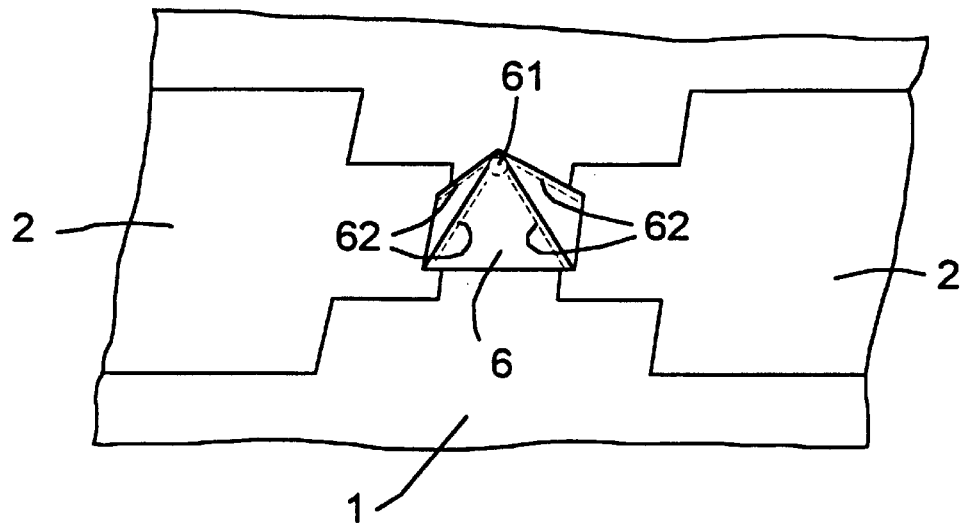
FIG. 6 is a top perspective view which shows a component according to the invention, having two conductive regions and a pyramidal surface structure.

If a voltage of, for example, 1.5 V is applied to the gate electrode 10, then an inversion layer forms at the vertex of the pyramid 6. Since the pyramid 6 has a vertex with a radius of curvature of <10 nm, the inversion layer has a dimension of approximately 10 nm. The inversion layer is insulated from the doped regions 2 by a potential barrier. When the voltage applied to the gate electrode 10 is increased, the inversion layer grows and develops along the edges of the pyramid 6. The inversion layer at the vertex of the pyramid 6 thereby becomes connected to the doped regions 2 which form source/drain regions. The component represented in FIG. 5 therefore represents a single-electron transistor which can be driven by varying the gate voltage. FIG. 6 shows a view of the substrate 1 having the doped regions 2 and the pyramid 6. When a first voltage level is applied to the gate electrode 10 (which is not included in FIG. 6) an inversion layer 61 forming a quantum dot develops at the vertex of the pyramid 6. So long as the first voltage level of the control voltage is applied to the gate electrode, the inversion layer 61 is insulated from the substrate 1 and from the doped regions 2 by potential barriers. If a second voltage level, which is higher than the first level, of the control voltage is applied to the gate electrode, then further inversion layers 62 develop along the edges of the pyramid 6. The inversion layer 61 at the vertex of the pyramid 6 is connected, via the inversion layers 62 along the edges of the pyramid, to the two doped regions 2 on whose surface the inversion layers 62 terminate.

FIG. 7 represents a view of a component according to the invention which is produced in similar fashion to the description relating to FIGS. 1 to 5. The component comprises a p⁻-doped monocrystalline silicon substrate 1' having four n⁺-doped regions 2'. A pyramid 6' whose edges each terminate on one of the doped regions 2' is grown on a main face of the substrate 1' by molecular beam epitaxy of p⁻-doped silicon. The pyramid 6' is fully covered with a gate dielectric and a gate electrode 10'.

Application of a first level of a control voltage to the gate electrode 10' causes an inversion layer 61' to develop at the vertex of the pyramid 6. The inversion layer 61' has dimensions in the nanometer range and represents a quantum dot which is insulated from the substrate 1' and from the doped regions 2' by potential barriers. When a second level, which is higher than the first level, of the control voltage is applied to the gate electrode 10', inversion layers 62', via which the inversion layer 61' is electrically connected to the doped regions 2' additionally develop along the edges of the pyramid 6'. FIG. 7 shows the connection arrangement via which a plurality of quantum dots are combined using the four connection regions 2'.

Figure 9:
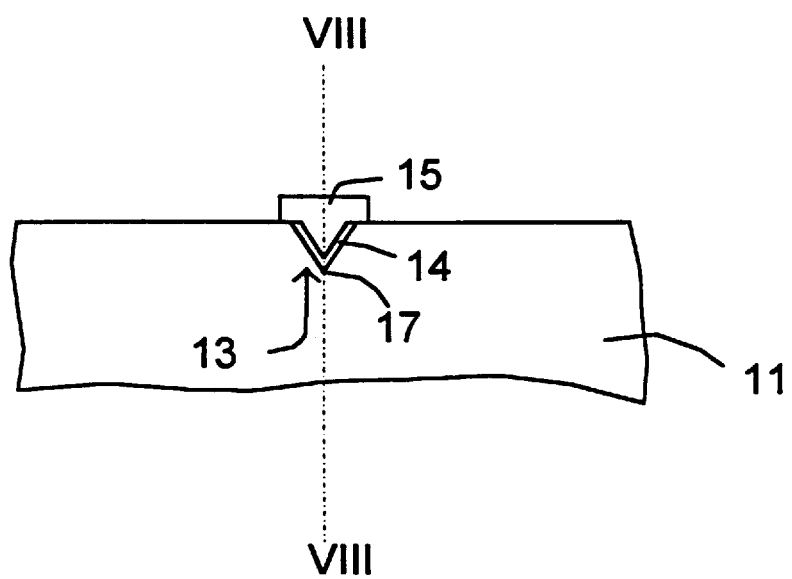
FIG. 9 is a side cross section of the component along line IX—IX in FIG. 8.

A component which has an indentation with V-shaped cross sections as its surface structure will be explained below with the aid of FIG. 8 and FIG. 9. The section shown in FIG. 8 through the component is indicated VIII—VIII in FIG. 9. The section shown in FIG. 9 through the component is indicated IX—IX in FIG. 8.

Two doped regions 12 are formed, for example by masked ion implantation, in a substrate 11 of, for example, monocrystalline p-doped silicon. The doped regions 12 are, for example, n⁺-doped. By using a mask with a rectangular cross section, a trench 13 with a V-shaped cross section is etched between the two doped regions 12 in a crystal orientation-dependent etching process, for example with KOH. The edge 17 of the V-shaped cross section then extends from one doped region 12 to the other.

The surface of the trench 13 is provided with a gate oxide 14, for example by thermal oxidation or by $SiO_2$ CVD. A gate electrode 15 of, for example, doped polysilicon, metal silicide or a metal, is produced on the surface of the gate oxide 14. Electrodes 16 of conductive material, for example doped polysilicon, metal silicide or metal, are formed on the surface of the doped regions 12. Application of a control voltage of, for example, 1.5 V to the gate electrode 15 causes an inversion layer, via which the two doped regions 12 are connected to one another, to form at the edge 17 of the trench 13.

Although other modifications and changes may be suggested by those skilled in the art, it is the intention of the inventors to embody within the patent warranted hereon all changes and modifications as reasonably and properly come within the scope of their contribution to the art.

We claim:

1. A microelectronic component, comprising:

a substrate of monocrystalline silicon at least at a main face, and, at least one surface structure on said main face having at least three faces intersecting at an intersection point and pairs of said at least three faces intersecting on straight intersection lines a gate dielectric which covers said at least one surface structure at least at said at least three intersecting faces, a gate electrode on the surface of the gate dielectric, at least two conductive regions at the main face, each on at least one of the straight intersection lines and insulated from the substrate, and between which, by applying a control voltage to the gate electrode, it is possible to control a current flow across an inversion layer which is formed along an intersection zone of the intersecting faces and at the intersection point when the control voltage is applied to the gate electrode.

2. A microelectronic component as claimed in claim 1, wherein said at least one surface structure is a monocrystalline silicon pyramid which projects above the main face, and the conductive regions are diffusion regions in the substrate, the at least one surface structure and the substrate being doped with a first conductivity type, and the conductive regions being doped with a second conductivity type, opposite to the first conductivity type.

3. A process for producing a microelectronic component, comprising the steps of:

provndng a substrate of monocrystalline silicon having a main face;

forming at the main face a surface structure having at least two faces intersecting at an intersection zone, including the steps of:

providing a mask which covers the main face outside an area for the surface structure, forming a monocrystalline silicon pyramid by epitaxial growth of silicon on the main face of the substrate, producing a gate dielectric which covers at least the intersecting faces of the surface structure, producing a gate electrode on a surface of the gate dielectric, producing, at the main face of the substrate, two conductive regions which are insulated from the substrate and between which, by applying a control voltage to the gate electrode, it is possible to control a current flow across an inversion layer which is formed along an intersection zone of the intersecting faces when the control voltage is applied to the gate electrode.

4. A process as claimed in claim 3, wherein the mask is formed of a double layer comprising a silicon oxide layer and a silicon nitride layer so that the silicon oxide layer has undercut etches under the silicon nitride layer, and the pyramid is produced by local molecular beam epitaxy.

5. A process as claimed in claim 3, wherein the substrate comprises silicon doped with a first conductivity type, said step of producing said two conductive regions being performed before said step of forming the monocrystalline silicon pyramid, said step of producing the two conductive regions including producing diffusion regions which are doped with a second conductivity type, opposite to the first conductivity type in said substrate, doping the monocrystalline silicon pyramid in situ with the first conductivity type, removing the mask after the monocrystalline silicon pyramid is formed.

* * * * *